United States Patent [19]

Law et al.

[11] Patent Number: 5,588,848

[45] Date of Patent: Dec. 31, 1996

[54] LOW INDUCTANCE SURFACE-MOUNT CONNECTORS FOR INTERCONNECTING CIRCUIT DEVICES AND METHOD FOR USING SAME

[75] Inventors: Ronald L. Law, Allen; Apurba Roy, Rockwall; Steven A. Shewmake, Mesquite, all of Tex.

[73] Assignee: Lucent Technologies Inc., Murray Hill, N.J.

[21] Appl. No.: 302,559

[22] Filed: Sep. 8, 1994

[51] Int. Cl.⁶ .................................................. H01R 9/09
[52] U.S. Cl. ................................................................. 439/83
[58] Field of Search .................................. 361/760, 782, 361/807, 809, 811; 439/83, 876, 607, 92

[56] References Cited

U.S. PATENT DOCUMENTS 4,605,278  8/1986  Seidler ........................... 339/275
4,915,652  4/1990  Madara .......................... 439/607
5,256,086  10/1993  Pom ............................. 439/607

OTHER PUBLICATIONS

F. W. Grover, *Inductance Calculations: Working Formulas And Tables*, Van Nostrand (1946).

*Primary Examiner*—Neil Abrams
*Assistant Examiner*—Barry Matthew L. Standig

[57] ABSTRACT

In accordance with the invention, a low inductance surface-mount connector comprises a slotted, hollow rectangular parallelepiped. The device permits interconnection by pick-and-place techniques, and the interconnection has advantageous qualities of compactness, low inductance, and mechanical compliance. A first circuit device having one or more circuit components is interconnected with a second circuit device by surface mounting such connectors on the first circuit device, providing corresponding solder pads on the second circuit device, and mounting the connectors of the first circuit device onto the pads of the second.

19 Claims, 2 Drawing Sheets

LOW INDUCTANCE SURFACE-MOUNT CONNECTORS FOR INTERCONNECTING CIRCUIT DEVICES AND METHOD FOR USING SAME

FIELD OF THE INVENTION

This invention relates to devices for interconnecting circuit devices such as IC packages to circuit boards, circuit boards to circuit boards or substrates and substrates to substrates. Specifically, the invention relates to low inductance surface-mount connectors having advantageous qualities of compactness, low interconnection inductance and mechanical compliance. The connectors can be surface mounted by pick-and-place techniques.

BACKGROUND OF THE INVENTION

As electronic circuits become denser, faster and increasingly complex, devices for interconnecting them are subject to more demanding requirements. With the great increase in the density of active components, interconnection devices become large consumers of available volume. And increased density brings an increase in required currents and power dissipation, aggravating thermal mismatch between connected circuit devices. In addition, higher circuit device speeds place stricter constraints on tolerable interconnect inductance. Accordingly, there is a need for improved devices for interconnecting circuits.

SUMMARY OF THE INVENTION

In accordance with the invention, a low inductance surface-mount connector comprises a slotted, hollow rectangular parallelepiped. The device permits interconnection by pick-and-place techniques, and the interconnection has advantageous qualities of compactness, low inductance, and mechanical compliance. A first circuit device having one or more circuit components is interconnected with a second circuit device by surface mounting such connectors on the first circuit device, providing corresponding solder pads on the second circuit device, and mounting the connectors of the first circuit device onto the pads of the second.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
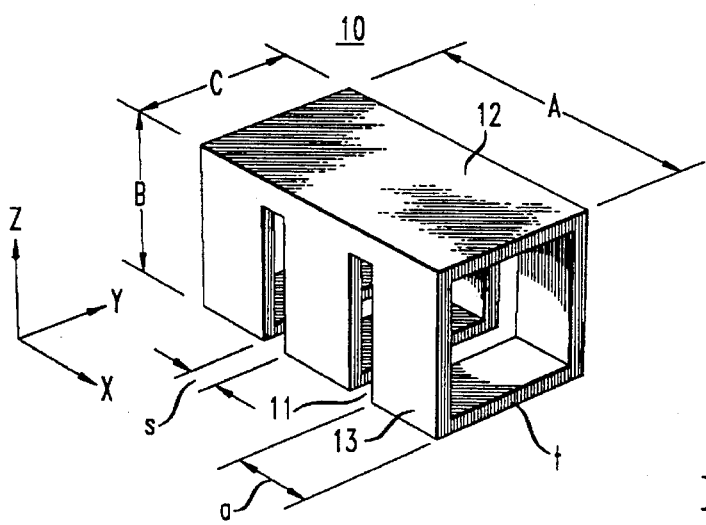
FIG. 1 is a perspective view of a low inductance surface-mount connector.

Referring to the drawings, FIG. 1 is a perspective view of a novel low inductance surface-mount connector comprising a metallic rectangular parallelepiped 10 which is hollow along the dimension A (the length). The connector advantageously has one or more slots 11 in planes transverse to the length A, the slots extending over three of the four sidewalls. The remaining sidewall 12 is unslotted to hold the connector together.

With reference to the coordinate system shown in FIG. 1, the parallelepiped is hollow along its x-axis (length, A), and the slots 11 are in the y-z plane. When used to interconnect two circuit devices, the mounting surfaces are chosen such that the two sidewalls that are perpendicular to the plane of the circuit devices are both slotted. In the embodiments shown in FIGS. 1–7, the mounting surfaces are the opposite sidewalls in the x-y plane, such as sidewalls 12. The connector thus provides electrical connectivity in the z-direction.

The connector height B is advantageously chosen to be greater than the height of the tallest component on the interconnect side of the circuit devices to be interconnected so that contact between the two circuit devices is only through the connectors. Preferably, B is larger in height than the tallest component by about 0.010" to 0.015".

The width C is advantageously greater or equal to B for placement stability. C is preferably equal to B in order to minimize the footprint of the connector.

Given B and C, a minimum metal thickness t is selected on the basis of mechanical device stability and manufacturability. Typically, t selected on these bases meets the compliance requirements in the y-direction. For preferred copper alloy materials such as phosphor-bronze, beryllium-copper or brass, typical metal thicknesses are in the range 0.005" to 0.020". Advantageously, the metal is plated with a thin layer (typically 0.0002") of copper or nickel, followed by solder to enhance solderability.

The width a of the conductive region 13 between slot 11 and the end and also between slots 11 is advantageously selected to be the maximum width permitted by compliance requirements in the x-direction. Compliance increases with the ratio B/a. Typically a is chosen such that $B/a \geq 2$. Thus a is B/2 or less.

The width s of each slot 11 is advantageously chosen to accommodate the maximum compliant excursion expected and to meet practical manufacturing constraints. Manufacturing constraints typically limit minimum s to about 0.010".

The number n of equally spaced slots 11, and hence the length A, is determined by the maximum inductance requirement. The device provides 2 (n+1) conductive regions 13 which are electrically parallel conductive paths in the z-direction, each with width a and thickness t. The device length is thus $A = ns + (n+1)a$. For placement stability, a further restriction on A is $A \geq B$. The device of FIG. 1 is shown without a seam. It can be conveniently fabricated from an extruded rectangular metal tube by cutting slots in the tubing and cutting off the ends to desired length A.

Figure 2:
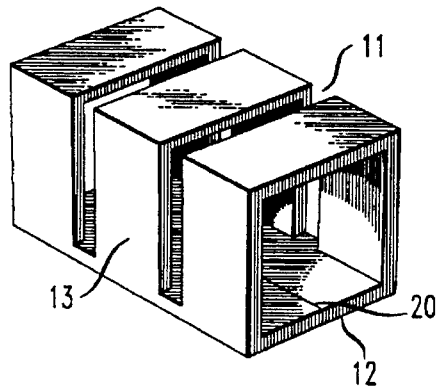
FIGS. 2–7 show additional examples of low inductance connectors.
Figure 3:
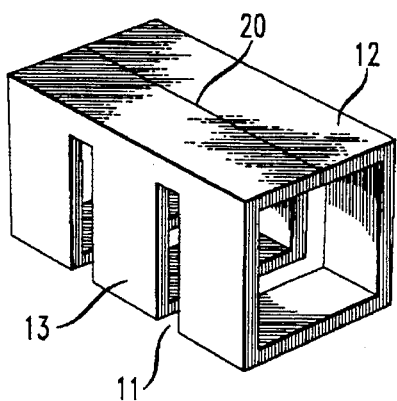

FIGS. 2 and 3 show top and bottom perspective views, respectively, of an alternate form of connector which can be fabricated by punching or etching the slots in a metal sheet and bending the sheet to the illustrated configuration. This embodiment differs from that shown in FIG. 1 by the presence of a seam 20 which preferably extends in a direction perpendicular to the planes of slots 11. Alternatively, the ends of the metal sheet comprising sidewall 12 can be bent in the opposite directions to form a lipped U-shaped connector with substantially the same mechanical and electrical behavior as the FIG. 3 embodiment when used to interconnect two circuit devices.

Figure 5:
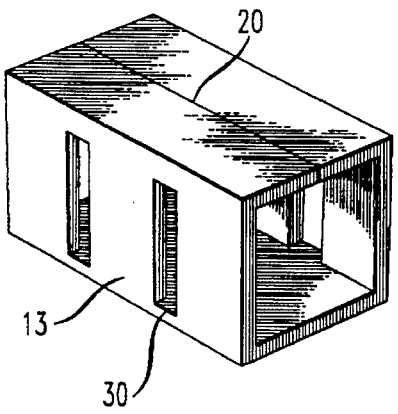
Figure 4:
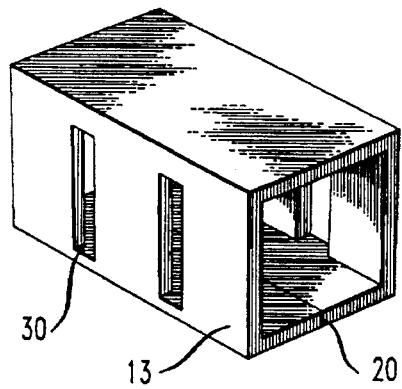

FIGS. 4 and 5 show an alternate form of the connector where the slots 30 are confined to opposing sidewalls. The seam 20 extends in a direction perpendicular to the slots. When the connector is used to interconnect two circuit devices, each pair of opposed slots behaves electrically and mechanically as a single slot 11 of FIG. 1.

Figure 6:
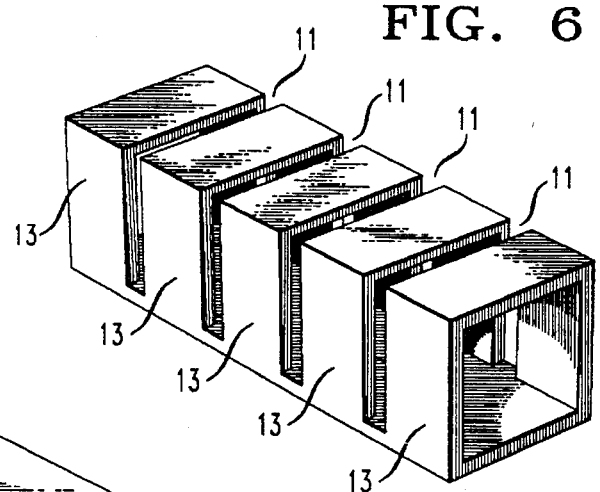
Figure 7:
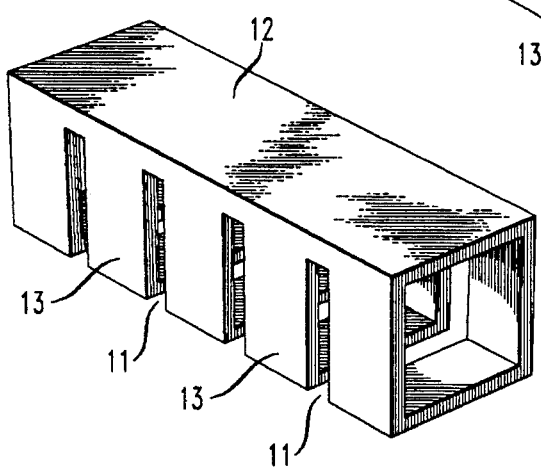

FIGS. 6 and 7 show yet another alternate form of the connector having n slots (here 4). It is noteworthy that with 4 slots, there will be 10 conductive regions 13 between the bottom and top of the connector.

The inductance associated with the connector is a function of the parameters B, C, t, s, a and n. With the first five parameters determined primarily from mechanical considerations, n (and thus A) can be varied to meet the inductive requirements. In general, the inductance monotonically decreases with increasing n.

The inductance L of each connector is the total inductance of an assembly of N=2(n+1) conductive regions 13 in parallel. Each conductor 13 has a self-inductance $L_i$ and is coupled to each other conductor in the connector through mutual inductances $M_{ij}$ where the $L_i$ and the $M_{ij}$ can be calculated from the device parameters by known methods described, for example, in Grover, F. W., *Inductance Calculations*, Van Nostrand (1946). In matrix notation, for a voltage V across the connector, the current rate $I_i$ through each conductor is:

$$[I_i]=[M_{ij}]^{-1}[V]$$

Thus, the total current rate I through the connector is $$I = \sum_{i=1}^{N} I_i$$

The connector inductance L is thus $$L=V/I.$$

Calculations show that in connectors with more than one slot, the conductive regions 13 in the center of the device tend to carry less current than the conductive regions at the ends. To optimize the device performance, the width of the conductive regions 13 can be varied with the widest regions in the center and the narrowest at the ends to provide more uniform current distribution.

Figure 8:
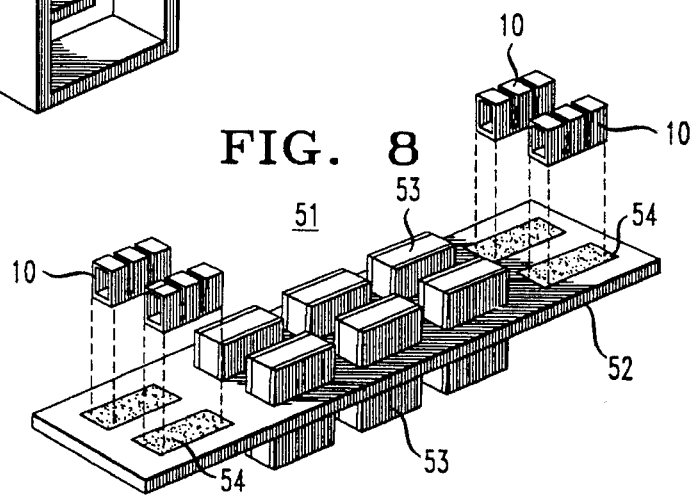
FIG. 8 is a perspective view showing how the connectors can be mounted on a first circuit device.

FIG. 8 is a perspective view showing surface mount connectors 10 being mounted on a first circuit device 51. The circuit device 51 comprises a substrate or circuit board 52, one or more circuit components 53 and one or more mounting pads 54 for receiving connectors 10. Advantageously, both connectors 10 and pads 54 are pre-coated with solder. Preferably the height of connectors 10 is greater than the height of any circuit component 53. The connectors can then be placed on the pads by standard pick-and-place techniques and can be soldered to the pads in a conventional solder reflow step.

Figure 9:
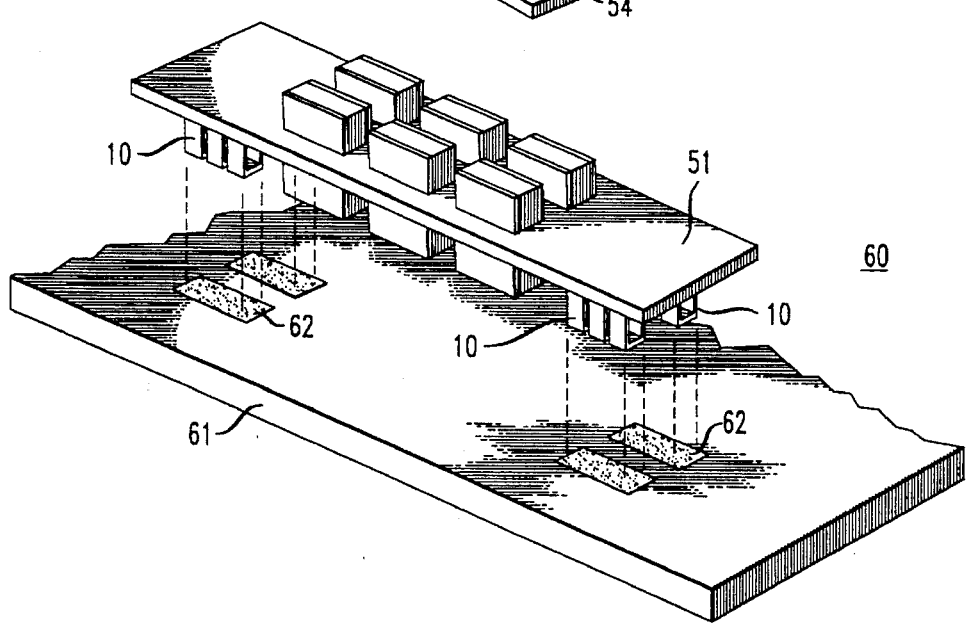
FIG. 9 is a perspective view showing how the first circuit device having connectors can be mounted on a second circuit device.

The next step shown in FIG. 9 is to mount the first circuit device 51 onto a second circuit device 60. Device 60 can also comprise a package or substrate or circuit board 61 and is preferably the larger area circuit device of the two. As a preliminary step, circuit device 60 is provided with solder pads 62 appropriate in size and distribution for receiving the connectors mounted on circuit device 51. The pads 62 are preferably pre-coated with solder, and circuit device 51 can be applied on device 60 using pick-and-place techniques with connectors 10 in registration with pads 62. The two circuit devices can then be interconnected by solder reflow. The result is an interconnected composite device having advantageous qualities of, compactness, low interconnection inductance and mechanical compliance with respect to thermal mismatch.

The nature and advantages of the invention will become clearer by consideration of the following specific example:

EXAMPLE

The principles of the invention were used to design and fabricate devices to meet the requirements of a specific application. The application called for a total of four (I/O=4) surface mount interconnects between a circuit board made of FR4(TCE≅12×10$^{-6}$/K) and a circuit package made of 96% $Al_2O_3$ (TCE≅7×10$^{-6}$/K). The height of the tallest component on the interconnected side of the board was $H_c$≅0.050". The mechanical requirement was compliance under solder reflow and high operating temperatures, in spite of the large TCE mismatch. The electrical requirement was a maximum inductance per interconnect of 0.150 nH. In addition, a very small interconnect footprint was necessary: the size of the FR4 board was approximately 0.5"×2.0", and much of the interconnect-side area was needed for other components.

The minimum interconnect length was $H_c$=0.050–. The device height was chosen to be B=0.062" (B>$H_c$). Given B, C was chosen to be C=0.062" (C≧B). With these dimensions for B and C, metal thickness t of 0.008" or 0.007" was deemed sufficient for device stability, using a fabrication method involving bending metal sheet to produce devices such as shown in FIG. 2. Devices were made using both t=0.008" and t=0.007".

The value of a was selected as a=0.030" (B/a≧2). The slot width was fixed at s=0.010", a value consistent with both operational and manufacturing constraints.

N, and hence the device length A, was then determined by exact inductance calculations, using the method described earlier, on the basis of the minimum N necessary to meet the inductance requirement of L≦0.150 nH. For the values of B, C, a, s listed above, and for t=0.008", the device inductance L varied with N (and A) as shown in the following table:

| N | A | L | (t = 0.008") |
|---|---|---|---|
| 4 | 0.070" | 0.166 nH | |
| 6 | 0.110" | 0.134 nH | |
| 8 | 0.150" | 0.114 nH | |

For t=0.007", the corresponding values of L were:

| N | A | L | (t = 0.007") |
|---|---|---|---|
| 4 | 0.070" | 0.179 nH | |
| 6 | 0.110" | 0.145 nH | |
| 8 | 0.150" | 0.124 nH | |

Thus for both t=0.008" and t=0.007", N=6 was sufficient to meet the inductance requirement. The device length A was 0.110" in each case. The device footprint was 0.110"× 0.062", comparable to standard 1206 chip capacitors and resistors, and well within the small footprint requirement.

Connectors with the above dimensions were fabricated from rectangular metallic strips with etched slots. The base metals were (i) brass, (ii) a commercial phosphor-bronze alloy, C 51000, comprising 95% Cu and 5% Sn. Strip thicknesses were 0.008" and 0.007". The 0.008" parts (brass) were plated with 0.0001" thick Ni. The 0.007" parts (phosphor-bronze) were plates with 0.0001" Ni, followed by 0.0002" solder. A two-step tool and die arrangement was used in a hand press to form the strips into devices, as shown in FIG. 2, with the required dimensions.

Compliance Tests

Devices designed and fabricated as described above were used to test for interconnect compliance under thermal stress. To simulate actual application conditions, test boards were made out of FR4 (0.030" thick) and 96% $Al_2O_3$ (0.050" thick). The FR4 boards, each 3.2" long and 0.6" wide, were of two types, "x" and "y", depending on the pattern of solder pads on the interconnect side. These solder pads measured 0.125"×0.075", to accommodate the connectors. The x-type boards, designed for testing compliance in the device x-direction, had a pad pattern consisting of two rows of 7 pads each. The pads were oriented such that the device x-direction would be parallel to the board length. The center-to-center distance between pads was 0.500" along the board length, and 0.425" along the board width. The y-type boards, designed for testing compliance in the device y-direction, had a pad pattern identical to the x-types, except that the pad orientation was perpendicular, i.e., the device y-direction was parallel to the board length. The pad center-to-center distance was again 0.500" along the board length, and 0.375" along the board width. The alumina ($Al_2O_3$) boards, each 3.73" long, and 2.00" wide, were also made in "x" and "y" types, each type having a pad pattern identical to the corresponding FR4 board. Note that the test boards were designed to test either x- or y-direction compliance over a maximum interconnect-to-interconnect distance of 3.00".

Solder paste was applied to the pads on FR4 boards of both the "x" and "y" types, and devices with t=0.008" were placed on each pad (14 per board). IR solder reflow was used for soldering. Solder paste was then applied to the pads of corresponding alumina boards, and the FR4 boards were mounted onto them, such that the connector devices were aligned with the pads on the alumina boards. These assemblies were then put through IR solder reflow. The maximum reflow temperature was 210° C. The solder joints were inspected after cooling: no deterioration was found at any interconnection, either on the FR4 or the $Al_2O_3$ side. The assemblies were then subjected to thermal shock tests as follows:

(i) Each assembly at ambient temperature (300K) was immersed in liquid nitrogen (77K). Cool down took 12 s, for a thermal shock of 223K in 12 s. No solder joint deterioration was found.

(ii) Each assembly was heated to 180° C. (453K), and then immersed in liquid nitrogen. Cool down took 18 s, for a thermal shock of 376K in 18s. Again, no joint deterioration was found.

Comparison With Prior Art

The exemplary connector device provides a true surface mountable 0.062" long interconnect between two boards or packages that:

(i) Has an inductance less than 0.15 nH;
(ii) Is compliant to mismatch between FR4 and $Al_2O_3$;
(iii) Has a body size of 0.110"×0.062", and occupies 0.125"×0.075"=0.0094 $in^2$; of board space (pad size).
(iv) Is surface mountable in both device to first-board, and first-board to second-board interconnection.

Two exemplary prior art approaches to meeting the application requirements are pin grid arrays (PGAs) and compliant J leads. Commonly used to provide interconnect between ceramic ($Al_2O_3$) packages and FR4 boards, PGAs comprise pins brazed in an area array onto the package. The package is then thruhole mounted onto the FR4 board, or mounted into a multi-hole socket. The pins are typically 0.018" in diameter, and 0.100" long. Typical x- and y-pitch in the array is 0.100". Multiple pins are connected in parallel to provide the required low inductance per I/O for a particular application.

As determined through exact calculation, using the methods described previously, in order to meet the requirement L<0.15 nH, it would take at least 25 pins, in a 5×5 array. This would occupy 0.450"×0.450"=0.203 $in^2$ of board:21 times that of the connector described herein. Moreover, PGAs do not provide surface mountability.

Use of compliant J leads is a relatively recent approach to providing compliant interconnects in which the first-board to second-board connection is surface mountable. (U.S. Pat. No. 4,605,278.) It comprises "J" shaped leads, 0.018"×0.007" in cross-section, each with a solderable clip for attachment to the edge of the first board. At least 0.062" of the edges of both top and bottom sides of the board are taken up for attachment. These leads can be placed on 0.50" centers.

Using the version providing 0.062" long interconnects, it would take at least 20 such leads in parallel to meet the requirement L<0.15 nH. This would occupy a total of 2×0.062×0.964"=0.120 $in^2$ of board:13 times that of the connector described herein.

It is to be understood that the above-described embodiments are illustrative of only some of the many possible specific embodiments which can represent applications of the principles of the invention. Numerous and varied other arrangements can be made by those skilled in the art without departing from the spirit and scope of the invention.

We claim:

1. A surface-mount connector for electrically interconnecting two circuit devices comprising:

a metallic rectangular parallelepiped which is hollow along one axis, said parallelepiped having at least one slot in a plane transverse to said axis and extending over three of the four sidewalls of said hollow parallelepiped, the remaining sidewall being unslotted.

2. A surface-mount connector for electrically interconnecting two circuit devices comprising:

a metallic rectangular parallelepiped which is hollow along one axis, said parallelepiped having at least one slot in a plane transverse to said axis in each of two opposite sidewalls of said hollow parallelepiped, and at least one sidewall which is unslotted.

3. A connector according to claim 1 or claim 2 wherein at least one of said circuit devices to be interconnected has one or more components on the interconnect side and said connector has a height B greater than the height of the tallest of said components.

4. A connector according to claim 1 or claim 2 wherein said connector has a length A and a width C each of which is greater than or equal to height B.

5. A connector according to claim 1 or claim 2 wherein said connector has a width C equal to height B.

6. A connector according to claim 1 or claim 2 wherein said connector comprises copper alloy.

7. A connector according to claim 1 or claim 2 wherein said connector has a thickness in the range 0.005" to 0.020".

8. A connector according to claim 1 or claim 2 wherein said connector comprises a layer of copper or nickel.

9. A connector according to claim 1 or claim 2 wherein said connector comprises a layer of solder.

10. A connector according to claim 1 or claim 2 wherein the width of the conductive region between a slot and a connector end is B/2 or less where B is the height of the connector.

11. A connector according to claim 1 or claim 2 wherein said connector comprises a plurality of slots and the width of each conductive region between successive slots is B/2 or less where B is the height of the connector.

12. A connector according to claim 1 or claim 2 wherein said connector has a length A greater than the height B.

13. A connector according to claim 1 or claim 2 wherein one sidewall of said parallelepiped contains a seam.

14. A connector according to claim 1 or claim 2 wherein said connector comprises a plurality of slots defining conductive regions between successive slots and the width of said conductive regions is greater in conductive regions near the center of the length in order to achieve more uniform current distribution.

15. An interconnected device comprising two circuit devices interconnected by the connector of claim 1 or claim 2.

16. A method for interconnecting a first circuit device to a second circuit device comprising the steps of:

providing said first circuit device with one or more mounting pads;

placing on said mounting pads one or more surface-mount connectors of claim 1;

soldering said one or more connectors to said first circuit device;

providing a second circuit device with one or more mounting pads for receiving said connectors on said first circuit device;

placing said first circuit device on said second circuit device with said connectors on said mounting pads of said second circuit device; and soldering said connectors to said mounting pads on said second circuit device.

17. A method for interconnecting a first circuit device to a second circuit device comprising the steps of:

providing said first circuit device with one or more mounting pads;

placing on said mounting pads one or more surface-mount connectors of claim 2;

soldering said one or more connectors to said first circuit device;

providing a second circuit device with one or more mounting pads for receiving said connectors on said first circuit device;

placing said first circuit device on said second circuit device with said connectors on said mounting pads of said second circuit device; and soldering said connectors to said mounting pads on said second circuit device.

18. The method of claim 16 or claim 17 wherein said at least one surface mount connector is soldered to said first circuit device by solder reflow.

19. The method of claim 16 or claim 17 wherein the surface mount connectors on said first circuit device are soldered to said second circuit device by solder reflow.

* * * * *